US008711296B2

(12) United States Patent
Tanaka et al.

(10) Patent No.: US 8,711,296 B2
(45) Date of Patent: Apr. 29, 2014

(54) ACTIVE MATRIX SUBSTRATE, METHOD FOR MANUFACTURING SAME, AND LIQUID CRYSTAL DISPLAY APPARATUS

(75) Inventors: Tetsunori Tanaka, Osaka (JP); Atsushi Ban, Osaka (JP); Tohru Senoo, Osaka (JP); Wataru Nakamura, Osaka (JP); Yukimine Shimada, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 594 days.

(21) Appl. No.: 12/671,801

(22) PCT Filed: Aug. 4, 2008

(86) PCT No.: PCT/JP2008/063970
§ 371 (c)(1),
(2), (4) Date: Feb. 2, 2010

(87) PCT Pub. No.: WO2009/044583
PCT Pub. Date: Apr. 9, 2009

(65) Prior Publication Data
US 2010/0259715 A1 Oct. 14, 2010

(30) Foreign Application Priority Data

Oct. 2, 2007 (JP) .................................. 2007-259205

(51) Int. Cl.
*G02F 1/136* (2006.01)
(52) U.S. Cl.
USPC ............................................ 349/51; 257/277
(58) Field of Classification Search
None
See application file for complete search history.

(56) References Cited

U.S. PATENT DOCUMENTS

| | | |
|---|---|---|
| 2001/0024247 A1 | 9/2001 | Nakata et al. |
| 2003/0043309 A1 | 3/2003 | Nakata et al. |
| 2005/0003640 A1 | 1/2005 | Ushiyama et al. |
| 2005/0186359 A1 | 8/2005 | Ishizuka et al. |
| 2007/0096096 A1 | 5/2007 | Kuwabara |
| 2008/0272388 A1 | 11/2008 | Ushiyama et al. |

FOREIGN PATENT DOCUMENTS

| | | |
|---|---|---|
| CN | 1573449 A | 2/2005 |
| CN | 1658032 | 8/2005 |
| JP | 10-153770 | 6/1998 |
| JP | 2001-264810 | 9/2001 |
| JP | 2001-281680 | 10/2001 |
| JP | 2005-070723 | 3/2005 |
| JP | 2005-210081 | 8/2005 |
| JP | 2007-094028 | 4/2007 |

OTHER PUBLICATIONS

International Search Report for PCT/JP2008/063970, mailed Nov. 18, 2008.

*Primary Examiner* — Lucy Chien
(74) *Attorney, Agent, or Firm* — Nixon & Vanderhye P.C.

(57) ABSTRACT

An active matrix substrate (30) of the present invention includes a substrate, a gate line (50) formed on the substrate, and an interlayer insulating layer (90) for insulating a layer formed on the gate line (50) from the gate line (50). In a region of the substrate, the interlayer insulating layer (90) is not provided on an upper surface of the gate line (50), and therefore, the upper surface is exposed. On the other hand, the insulating layer (90) is provided on the substrate so as to have contact with at least an edge face of the gate line (50) which edge face is on an extension of a longitudinal direction of the gate line (50).

12 Claims, 14 Drawing Sheets

F I G. 1 4
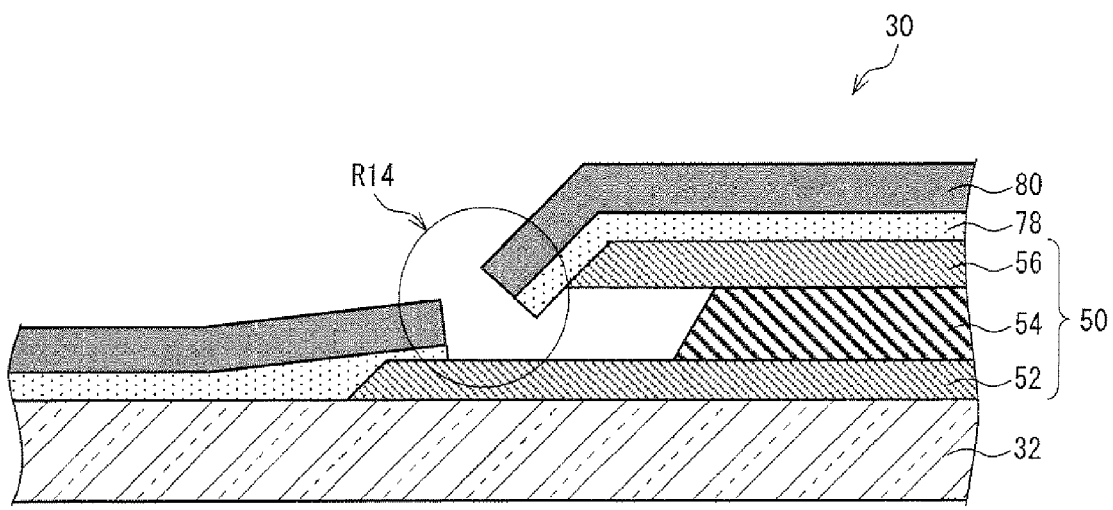

US 8,711,296 B2

ACTIVE MATRIX SUBSTRATE, METHOD FOR MANUFACTURING SAME, AND LIQUID CRYSTAL DISPLAY APPARATUS

This application is the U.S. national phase of International Application No. PCT/JP2008/063970, filed 4 Aug. 2008, which designated the U.S. and claims priority to Japanese Patent Application No. 2007-259205, filed Oct. 2, 2007, the entire contents of each of which are hereby incorporated by reference.

TECHNICAL FIELD

The present invention relates to an active matrix substrate for use in a liquid crystal display apparatus, and a liquid crystal display apparatus in which the active matrix substrate is provided.

BACKGROUND ART

A liquid crystal display apparatus has been widely used as a display apparatus such as a television or a monitor.

Particularly, an active matrix liquid crystal display apparatus in which a transistor which serves as a switching element is provided in each of pixels has been recently mainstream of liquid crystal display apparatuses, from viewpoints of high display quality and high-speed response.

In general, a liquid crystal display panel constituting the active matrix liquid crystal display apparatus is made by combining, as a pair, a color filter substrate serving as a counter substrate with an active matrix substrate.

The active matrix substrate includes pixel electrodes arranged in a grid pattern, a plurality of gate lines and a plurality of source lines, and thin-film transistors (TFT) each serving as a switching element and each provided in the vicinity of an intersection of a corresponding one of the plurality of gate lines and a corresponding one of the plurality of source lines. Each of the plurality of gate lines is provided between corresponding two adjacent ones of the pixel electrodes, and each of the plurality of source lines is provided between corresponding two adjacent ones of the pixel electrodes. The plurality of gate lines and the plurality of source lines are provided so as to orthogonally intersect with each other.

In a pixel region which is a display region of the liquid crystal display panel, in general, an insulating layer is provided between (i) a gate line and (ii) respective of a pixel electrode and a source line.

The plurality of gate lines and the plurality of source lines are provided so as to be partially exposed, for their electrical connections with other components, in a terminal region which is a peripheral region of the liquid crystal display panel.

(Patent Literature 1)

A liquid crystal display apparatus having such an arrangement is exemplified by a liquid crystal display apparatus disclosed in Patent Literature 1. Specifically, Patent Literature 1 discloses an arrangement as below. In a display region (pixel region), a gate electrode and a source electrode are formed on a first transparent substrate via a gate insulating film. Further, the gate electrode, the gate insulating film, and the source electrode are covered by a protection film.

In a terminal region on the periphery of the display region, the protection film is formed in the terminal region except a region where a line terminal section is provided.

(Patent Literature 2)

Patent Literature 2 discloses an arrangement as below. In a pixel region, an upper insulating film is provided on a signal line (source line) so that a surface of the upper insulating film is planarized. Then, a pixel electrode is formed on the upper insulating film.

(Patent Literature 3)

Patent Literature 3 discloses an arrangement as below. In a pixel section (pixel region) and a terminal section (terminal region), an underlayer is provided on a substrate, and then, lines are formed on the underlayer.

CITATION LIST

Patent Literature 1

Japanese Unexamined Patent Application Publication, Tokukai, No. 2007-94028 A (Publication Date: Apr. 12, 2007)

Patent Literature 2

Japanese Unexamined Patent Application Publication, Tokukai, No. 2001-281680 A (Publication Date: Oct. 10, 2001)

Patent Literature 3

Japanese Unexamined Patent Application Publication, Tokukai, No. 2005-210081 A (Publication Date: Aug. 4, 2005)

SUMMARY OF INVENTION

Unfortunately, a conventional liquid crystal display apparatus such as that disclosed in Patent Literature 1 has problems in that a line is likely to be exfoliated in the terminal region, and cutting of a layer stacked on the line is likely to occur. This is described below with reference to figures.

FIG. 10 is a top view illustrating a schematic arrangement of a liquid crystal display panel 10.

As illustrated in FIG. 10, the liquid crystal display panel 10 is formed by attaching a color filter substrate 20 to an active matrix substrate 30. The active matrix substrate 30 is a size larger, as compared to the color filter substrate 20. It follows that the active matrix substrate 30 has a part where the active matrix substrate 30 and the color filter substrate 20 do not overlap each other, on a peripheral region of the liquid crystal display panel 10.

It is assumed that a region which occupies a central region of the liquid crystal display panel 10 and displays an image is indicated by a pixel region RA. On the other hand, it is assumed that a region, in which lines for external electrical connections are formed in the part of the active matrix substrate 30 where the active matrix substrate 30 and the color filter substrate 20 do not overlap each other, is indicated by a terminal region RB.

FIG. 11 is an enlarged view of a region R1 which is a part of the terminal region RB of the liquid crystal display panel 10 illustrated in FIG. 10. The enlarged view illustrates an arrangement of lines formed in the region R1.

As illustrated in FIG. 11, in the terminal region RB, a plurality of lines such as a plurality of gate lines 50 are formed in substantially parallel with each other.

FIG. 12 is a view illustrating a cross-section along a line A-A in the terminal region RB illustrated in FIG. 11.

(Three-layered Gate Line Structure)

FIG. 12 illustrates a case where a gate line 50 which is a line formed in the terminal region RB has a three-layered structure. FIGS. 13 through 15 also exemplify cases where the gate line 50 has a three-layered structure.

For example, as illustrated in FIG. 12, in a case where the gate line 50 has a three-layered structure in which a titanium (Ti) (first titanium layer 52), an aluminum (Al) (aluminum layer 54), and a titanium (Ti) (second titanium layer 56) are stacked, in this order, on a glass substrate 32, the aluminum layer 54 which is sandwiched between the first and second titanium layers is etched to a greater degree than the first titanium layer 52 and the second titanium layer 56, due to effects of chemical solution resistance etc. during patterning of the gate line 50. As a result, a gap (see a region R10 in FIG. 12) is formed between the first titanium layer 52 and the second titanium layer 56.

The gap has led to exfoliation of the gate line 50 and/or cutting of a layer stacked on the gate line 50, as is described below.

It should be noted that the plurality of gate lines 50 which are arranged in parallel have substantially a same cross-sectional shape (see FIG. 15 which is a view illustrating a cross-section along a line B-B shown in FIG. 11.

(Exfoliation)

The following describes the exfoliation of the gate line 50.

As illustrated in FIG. 13 which is a view schematically illustrating how the gate line 50 is exfoliated, no aluminum layer 54 resides under the second titanium layer 56 which defines an upper part of the gap (see the region R10 in FIG. 12). Therefore, the second titanium layer 56 is likely to be deformed, for example, is likely to be folded back (see the region R12 in FIG. 13). This ultimately causes the second titanium layer 56 to be exfoliated.

(Cutting)

The following describes the cutting.

FIG. 14 is a view illustrating the cutting of a layer stacked on the gate line 50. Herein, the "cutting" means that a layer is broken at a step.

As illustrated in FIG. 14, in a case where a gate insulating layer 78 and a channel semiconductor layer 80 are stacked on the gate line 50 having the gap (see the region R10 in FIG. 12) between the first and second titanium layer 56 and 52, the gate insulating layer 78 and the channel semiconductor layer 80 are provided so as to cover the gap R10. As described above, the second titanium layer 56 is likely to be folded. This deformation causes the gate insulating layer 78 and the channel semiconductor layer 80 to be broken. Thus, a so-called cutting is caused. In some cases, the cutting is caused due to a large step between the second titanium layer 56 and the first titanium layer 52 or a large step between the second titanium layer 56 and the glass substrate 32.

(Single-layered Gate Line Structure)

The description deals with the case where the gate line 50 has a three-layered structure, with reference to FIGS. 12 through 15. Note however that such exfoliation and cutting are also caused even in a case where the gate line 50 has a single-layered structure.

That is, the gate line 50 sometimes has a cross-sectional shape, i.e., a so-called inverse tapered shape, in a case where the gate line 50 has a single-layered structure in which titanium or aluminum layer is merely provided, as is illustrated in FIG. 16 which corresponds to the cross-sectional view taken along the line A-A in FIG. 11 in a case where the gate line 50 has such a single-layered structure. The inverse tapered shape intends to a shape of the gate line 50 whose line width becomes wider as a distance is farther away from a contact surface between the gate line 50 and the glass substrate 32. That is, the inverse tapered shape intends to a shape having the narrowest line width at the contact surface between the gate line 50 and the glass substrate 32.

FIG. 17 is a view illustrating a cross-section, taken along a line B-B in FIG. 11, which is obtained in a case where the gate line 50 has a single-layered structure. As illustrated in FIG. 17, in a case where the gate line 50 has the single-layered structure, the plurality of gate lines 50 which are arranged in parallel have substantially a same cross-sectional shape (invert tapered shapes).

The gate line 50 having such an invert tapered shape is also likely to be exfoliated and be cut, as is the case with the gate line 50 having the foregoing gap.

Namely, in a case where (i) a contact area becomes small between the gate line 50 having the invert tapered shape and the glass substrate 32 and (ii) an object makes contact with a top part of the invert tapered shape, a stress which induces exfoliation is easily produced.

In a case where a gate insulating layer 78 and a channel semiconductor layer 80 are stacked on the gate line 50 having the tapered shape, a gap is likely to be formed by the gate insulating layer 78, the channel semiconductor layer 80, and an edge part of the tapered shape of the gate line 50.

The gate insulating layer 78 and the channel semiconductor layer 80 which cover the gap are likely to be broken, for the same reason as that explained above with reference to FIG. 14. That is, the cutting is likely to occur at the edge part of the invert tapered shape (region R16 in FIGS. 16 and 17).

As described above, lines such as the plurality of gate lines 50 in the terminal region are likely to have defects such as exfoliation and cutting. However, it is difficult that the conventional arts avoid occurrences of such defects.

That is, according to the arrangement disclosed in Patent Literature 1, a protection film is formed on the lines. However, the protection film is provided in a region except a line terminal section (the terminal region). Accordingly, it is difficult to suppress the occurrences of defects in the terminal region.

According to the arrangement of Patent Literature 2, an underlayer is formed so as to improve adhesion of a substrate and lines. Note however that the defects in the terminal region occur in the vicinity of surfaces of the lines, rather than in an interface between the substrate and the lines. Accordingly, it is difficult to suppress the occurrences of the defects in the terminal region.

According to the arrangement of Patent Literature 3, adhesion of lines is low because the lines are formed by droplet ejection.

The present invention was made in view of the problems. An object of the present invention is to realize (i) an active matrix substrate in which occurrences of terminal defects such as exfoliation of a line and cutting of a laminated body are suppressed in a peripheral region where terminals etc. are formed, (ii) a method for manufacturing the active matrix substrate, and (iii) a liquid crystal display apparatus.

In order to attain the object, an active matrix substrate of the present invention includes: a substrate; at least one line formed on the substrate; and an insulating layer for electrically insulating a layer formed on the at least one line from the at least one line, in a region of the substrate, the insulating layer not being provided on an upper surface of the at least one line, the upper surface being exposed, and the insulating layer being provided on the substrate so as to have contact with at least an edge face of the at least one line, the edge face being on an extension of a longitudinal direction of the at least one line.

The active matrix substrate of the present invention is preferably arranged such that the insulating layer is provided on the substrate so as to have contact with the edge face in the region of the substrate.

The active matrix substrate of the present invention can be arranged such that the region of the substrate is a peripheral region of the substrate.

The active matrix substrate of the present invention can be arranged such that the region of the substrate is a connection region of the substrate.

According to the arrangement, the upper surface of the line is exposed in the region of the substrate. This makes it possible to form an electrical connection between the line, and another line, another component, and/or the like.

In a case where the region of the substrate is provided as, e.g., the connection region in the peripheral region of the substrate, the line serves as an electrical connection point.

On the other hand, even though the line is not used as the electrical connection point, the line can be used as a marker for alignment, or as a character label, because the upper surface of the line is exposed.

The insulating layer is formed so as to have contact with the edge face of the line (with at least the edge face on an extension of a longitudinal direction of the line).

Therefore, the insulating layer suppresses exfoliation of the line from the substrate and a break of a layer formed on the line. This is described below.

(Exfoliation)

In a case where the line has a multilayered structure such as a three-layered structure, in some cases, respective edge faces of layers of the line are not leveled off in a process of patterning the line. This leads to formation of a concavity and/or a convexity on the edge faces. The concavity and convexity are likely to arise in a case where materials of the layers are different from each other.

In a case where the line has a single-layered structure, in some cases, the line has a cross section of the invert tapered shape. The inverse tapered shape intends to a cross-sectional shape of the line whose line width becomes wider from a contact surface between the line and the substrate to the upper surface of the line.

The line having the concavity and/or convexity on its edge face, or having the invert tapered cross-sectional shape is likely to be exfoliated.

That is, the concavity and convexity on the edge face of the line have respective projections. Deflection and, further, exfoliation of the line are likely to arise at the projections.

In addition, the exfoliation of the line has been likely to arise at a top of the inverse tapered cross-sectional shape, in other words, at a part protruding like eaves.

In contrast, according to the arrangement of the present invention, the insulating layer is formed so as to have contact with the edge face of the line. Accordingly, the insulating layer is formed in a depressed part (e.g., in a gap of the concavity) even though the concavity and convexity are formed on the edge face of the line. The insulating layer formed in the depressed part has an effect of holding the line. As a result, the exfoliation of the line is less likely to occur.

Similarly, the effect of holding the line produced by the insulating layer also suppresses the exfoliation of the line having the invert tapered shape.

(Cutting)

The arrangement further suppresses a break (cutting) of a layer formed on the line. This is described below.

A layer formed on the line having the concavity and/or the convexity on its edge face, or having the invert tapered cross-sectional shape has been likely to be broken.

That is, in a case where a layer (upper layer) covering the line having such a shape is formed, the upper layer is likely to have an area having no contact with the line which is an underlayer against the upper layer. In other words, a gap is likely to be formed between the upper layer and the line. For example, the gap is likely to be formed at a depressed part of the concavity, and/or in the vicinity of a contact point between the substrate and the line having the inverse tapered shape.

A break has been likely to occur at an upper layer on the gap when, for example, a force externally presses the upper layer, or a force pulls up the upper layer.

In contrast, according to the arrangement of the present invention, the insulating layer is formed so as to have contact with the edge face of the line. Accordingly, even if, e.g., the concavity and/or the convexity is formed on the edge face of the line, a depressed part (such as the gap of the concavity) etc. on the edge face are filled since the insulating layer is formed in the depressed part etc. In addition, a large step is less likely to arise between layers and between the layers and the substrates.

The insulating layer also fills in a depressed part in the vicinity of the contact point between the line having the inverse tapered shape and the substrate.

Therefore, the gap is less likely to be formed between a layer (upper layer) formed on the line and the line. As a result, the upper layer is less likely to be broken.

Thus, the active matrix substrate having the arrangement above makes it possible to realize an active matrix substrate in which occurrences of terminal defects such as exfoliation of a line and cutting of a laminated body are suppressed in the peripheral region where terminals etc. are formed.

The active matrix substrate of the present invention is preferably arranged such that, in a region where the insulating layer has contact with the edge face, the insulating layer has a thickness of not more than a film thickness of the at least one line.

According to the arrangement, in the region where the insulating layer has contact with the edge face, the insulating layer has the thickness of not more than the film thickness of the line.

Accordingly, no insulating layer is formed which protrudes higher than the upper surface of the line. This helps realizing a gradual decrease in layer (the line and insulating layer) thickness from the line to the insulating layer. That is, planarization of a structure is realized.

This makes it easy to secure an electrical connection to the line, e.g., in a case where the line is used as a terminal. In addition, this prevents occurrence of the exfoliation of the line and the insulating layer from the substrate, in particular, the exfoliation of the insulating layer.

The active matrix substrate of the present invention is preferably arranged such that the insulating layer, which has contact with the edge face, has a width of not less than a film thickness of the insulating layer, from the edge face at least in a direction parallel with the substrate.

According to the arrangement, a contact length between which the insulating layer has contact with the substrate is not less than the film thickness of the insulating layer. Accordingly, the insulating layer is unlikely to be exfoliated from the substrate. In addition, the line having contact with the insulating layer is also unlikely to be exfoliated from the substrate.

A maximum width of the insulating layer along a direction parallel with the substrate is, for example: a width to an adjacent line in a case where there is such an adjacent line; a width to an end of the substrate in a case where the end is close; a width to an end of the peripheral region of the substrate; or the like.

The active matrix substrate of the present invention is preferably arranged such that: a thin-film transistor serving as a switching element is formed on the substrate; and the at least one line is a gate line connected with the thin-film transistor, a source line connected with the thin-film transistor, or both the gate line and the source line.

According to the arrangement, the at least one line is a gate line, a source line, or both the gate line and the source line. Accordingly, it is possible to directly supply a signal for control the thin-film transistor via the line in the peripheral region.

The active matrix substrate of the present invention is preferably arranged such that the region of the substrate includes a terminal region where the at least one line is electrically connected with a component.

The arrangement makes it possible to use the line as a connection terminal for external connection.

Accordingly, the line is less likely to be exfoliated even though a stress is applied to the line when a component or the like is connected/attached to the line. This makes it possible to secure reliability of connection between the line and the component or the like.

The active matrix substrate of the present invention is preferably arranged such that: the substrate has a rectangular shape; and the region of the substrate includes at least one of four peripheral regions of the substrate.

The arrangement makes it possible to easily draw out the line provided in a lattice pattern in the substrate having the rectangular shape to a region where an external electrical connection is allowed.

The active matrix substrate of the present invention is preferably arranged such that the insulating layer is made of an insulating material containing an organic component.

According to the arrangement, a material of the insulating layer contains the organic component. This makes it possible to easily form a thick insulating layer on an entire surface of the substrate by a coating method such as spin coating or a printing method.

The active matrix substrate of the present invention is preferably arranged such that the insulating layer contains silicon.

According to the arrangement, the insulating layer contains silicon. This makes it possible to easily obtain a glass film (silica film) by coating the insulating layer to the substrate. In general, such a film has a low specific inductive capacity. Therefore, it is possible to obtain an active matrix substrate having a fine electrical characteristic.

The active matrix substrate of the present invention can be arranged such that the at least one line has a multilayered structure.

According to the arrangement, the line has a multilayered structure. As a result, it is easy to give desired mechanical and electrical characteristics to the line.

In addition, even if the line has the multilayered structure, the line is less likely to be exfoliated, as is described above.

In order to attain the object, a method for manufacturing an active matrix substrate on which a thin-film transistor serving as a switching element is formed, the method comprising the steps of: (a) forming a pattern of a line on a substrate; (b) forming an insulating layer so as to cover the line; and (c) patterning the insulating layer, wherein: in the step (c), the insulating layer on an upper surface of the line is removed so that the upper surface is exposed in a region where the line is electrically connected with a component, whereas the insulating layer which has contact with an edge face of the line is left in the region.

The arrangement makes it possible to easily form the insulating layer having contact with the edge face of the line.

Therefore, this makes it possible to easily realize an active matrix substrate in which occurrences of terminal defects such as exfoliation of a line and cutting of a laminated body are suppressed in the peripheral region where a terminal etc. are formed.

A liquid crystal display apparatus of the present invention preferably includes any one of the active matrix substrates.

The arrangement makes it possible to obtain a liquid crystal display apparatus with high reliability because the line of the active matrix substrate used in the liquid crystal display apparatus has high connection reliability.

The active matrix substrate of the present invention is arranged such that, in a region of the substrate, the insulating layer is not provided on an upper surface of the at least one line, the upper surface being exposed, and the insulating layer is provided on the substrate so as to have contact with at least an edge face of the at least one line, the edge face being on an extension of a longitudinal direction of the at least one line.

The method of the present invention for manufacturing an active matrix substrate includes: (a) forming a pattern of a line on a substrate; (b) forming an insulating layer so as to cover the line; and (c) patterning the insulating layer, wherein: in the step (c), the insulating layer on an upper surface of the line is removed so that the upper surface is exposed in a region where the line is electrically connected with a component, whereas the insulating layer which has contact with an edge face of the line is left in the region.

This makes it possible to provide (i) an active matrix substrate in which occurrences of terminal defects such as exfoliation of a line and cutting of a laminated body are suppressed in the peripheral region where a terminal etc. are formed, and (ii) a method for manufacturing the active matrix substrate.

BRIEF DESCRIPTION OF DRAWINGS

FIG. 14 is a view illustrating the conventional liquid crystal display apparatus, which view illustrates cutting of a layer stacked on the gate line.

REFERENCE SIGNS LIST

30 Active matrix substrate
32 Glass substrate (substrate)
40 Pixel electrode
50 Gate line (line)
70 Thin-film transistor
84 Storage capacitor section
90 Interlayer insulating layer (insulating layer)
RA Pixel region
RB Terminal region

DESCRIPTION OF EMBODIMENTS

The following describes an active matrix substrate of an embodiment of the present invention, with reference to drawings.

Figure 1:
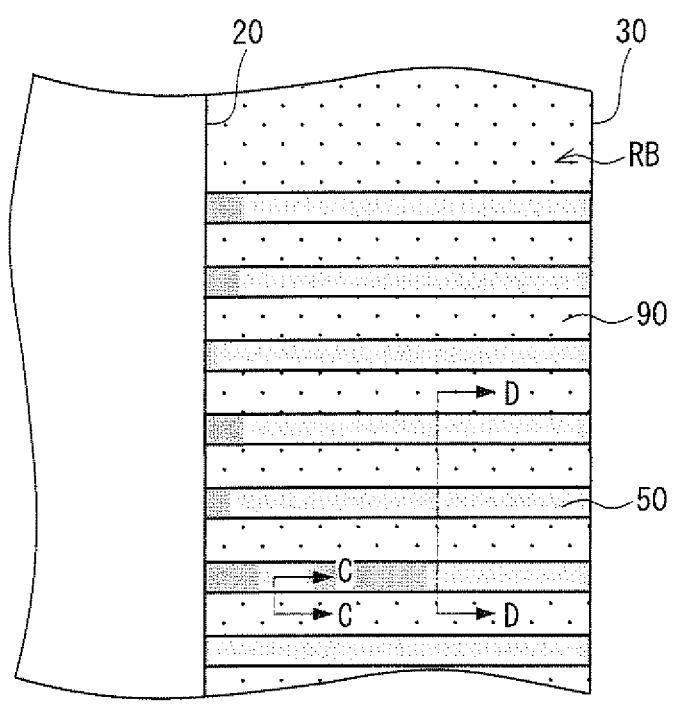
FIG. 1 is a top view of an embodiment of the present invention, which top view illustrates a schematic arrangement of a terminal region of an active matrix substrate

A feature of the present invention resides in an arrangement of a so-called SOG (Spin-On Glass) layer in a peripheral region (chiefly in a terminal region) of the active matrix substrate. Specifically, as illustrated in FIG. 1 which is a top view of a terminal region RB of an active matrix substrate 30 in accordance with the present embodiment, in the terminal region RB, an interlayer insulating layer 90 is also provided in a region between any adjacent two lines such as gate lines 50 so as to have contact with the any adjacent two lines. The following describes this in detail.

(Structure of Active Matrix Substrate)

Figure 2:
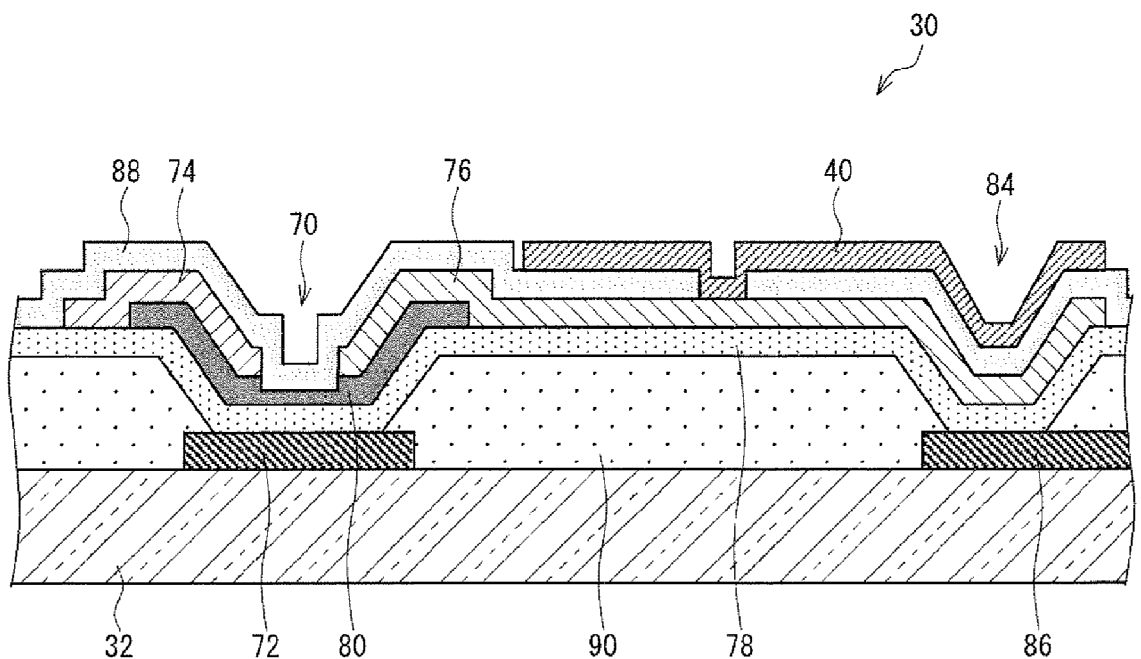
FIG. 2 is a cross-sectional view illustrating the embodiment of the present invention, which cross-sectional view illustrates an overview of a layered structure of the active matrix substrate.
Figure 10:
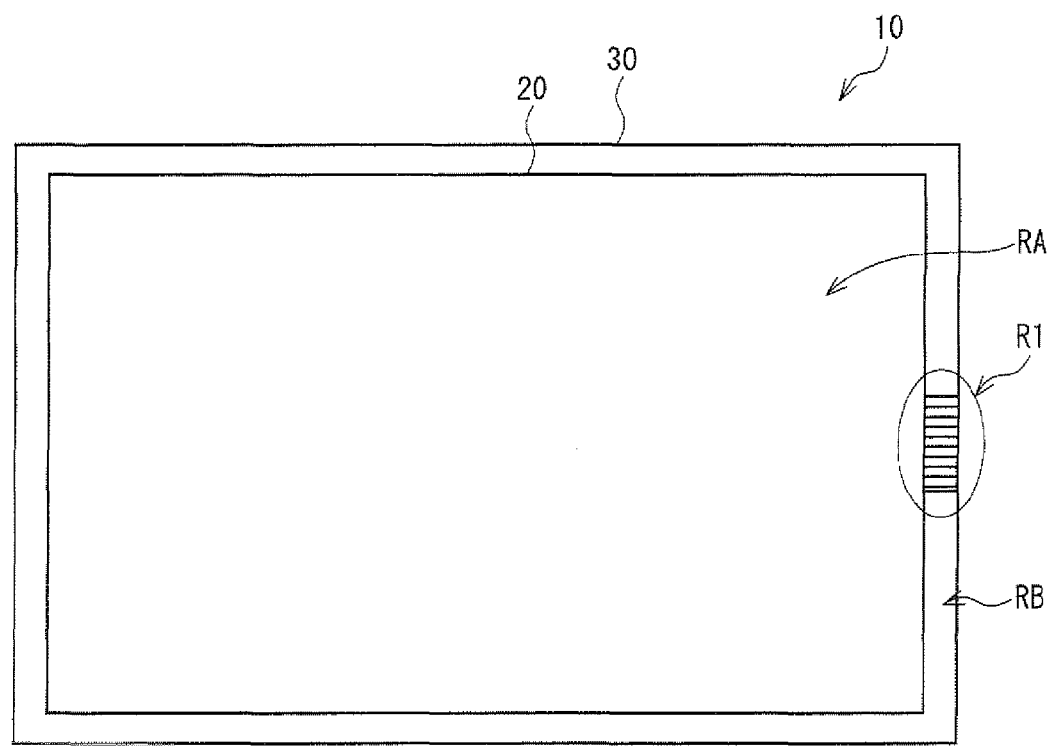
FIG. 10 is a schematic top view of a liquid crystal display panel.

The following schematically describes a layer arrangement of the active matrix substrate of the present embodiment, with reference to FIG. 2. FIG. 2 is a cross-sectional view illustrating a schematic arrangement of the active matrix substrate in a pixel region. The pixel region intends to the display region of the liquid crystal display panel 10, as described above with reference to FIG. 10 (see a region RA illustrated in FIG. 10).

As illustrated in FIG. 2, in the display region, the active matrix substrate 30 of the present embodiment has nearly the same arrangement as that of a common active matrix substrate 30.

That is, a thin-film transistor (TFT) 70 which serves as a switching element and a pixel electrode 40 connected to the thin-film transistor 70 are chiefly formed on a glass substrate 32. A storage capacitor section 84 is formed under the pixel electrode 40.

Specifically, the thin-film transistor 70 is formed as below. First, a gate electrode 72 is formed on the glass substrate 32. A channel semiconductor layer 80 is formed above the gate electrode 72 via a gate insulating layer 78. The channel semiconductor layer 80 is connected with a source electrode 74 and a drain electrode 76. Further, a protection layer 88 is provided on the source electrode 74 and the drain electrode 76.

The pixel electrode 40 is connected with the drain electrode 76 of the thin-film transistor 70.

In the storage capacitor section 84, a storage capacitor electrode 86 is formed below the pixel electrode 40. This makes it possible to form a so-called storage capacitance.

(Interlayer Insulating Layer 90)

In the active matrix substrate 30 of the present embodiment, an interlayer insulating layer 90 is provided (i) between the gate electrode 72 and the storage capacitor electrode 86 and (ii) between the glass substrate 32 and the gate insulating layer 78. More specifically, an interlayer insulating layer 90 is provided (i) between any two adjacent conductors formed on the glass substrate 32 and (ii) between a layer formed above the glass substrate 32 and the glass substrate 32.

The interlayer insulating layer 90 is the so-called SOG layer, and is made of a material such as a spin-on glass material containing an organic component.

Specifically, as illustrated in FIG. 2, the interlayer insulating layer 90 is formed on an almost entire surface of the glass substrate 32. However, no interlayer insulating layer 90 is formed in a region where the gate insulating layer 78 and the gate electrode 72 overlap each other and in a region where the gate insulating layer 78 and the storage capacitor electrode 86 overlap each other.

This allows, in the thin-film transistor 70, only the gate insulating layer 78 to serve as an insulating layer for insulating the gate electrode 72 from the source electrode 74 and the drain electrode 76.

In the storage capacitor section 84, only the gate insulating layer 78 serves as a dielectric layer for a storage capacitor.

Accordingly, the thin-film transistor 70 is less likely to have a reduced driving performance, and the storage capacitor section 84 is less likely to have a reduced storage capacitance.

On the other hand, in a region in which neither thin-film transistor 70 nor the storage capacitor section 84 is formed, the interlayer insulating layer 90 which is a relatively thick insulating layer is formed between the glass substrate 32 and the gate insulating layer 78. This causes an improvement in insulation reliability of the pixel electrode 40 etc. The interlayer insulating layer 90 is also formed between the gate line 50 and a source line, in an intersecting region in which the gate line connected with the gate electrode 72 intersects with the source line connected with the source electrode 74, although this is not illustrated in FIG. 2.

This allows a reduction in shortcircuit between the gate line 50 and the source line in the intersecting region, and allows a reduction in capacitance (parasitic capacitance) formed in the intersecting region. This makes it possible to suppress deterioration in display quality due to the parasitic capacitance.

As described above, the interlayer insulating layer 90 can suppress deterioration in display quality due to the parasitic capacitance, without decreasing a function of the thin-film, transistor 70 and a function of the storage capacitor section 84.

(Manufacturing Flow)

The following describes how lines are arranged in the terminal region RB of the active matrix substrate 30 during each of manufacturing processes, while describing a manufacturing process flow of the active matrix substrate 30.

In the following description, a conventional manufacturing method and a manufacturing method of the present embodiment are contrasted.

Figure 3:
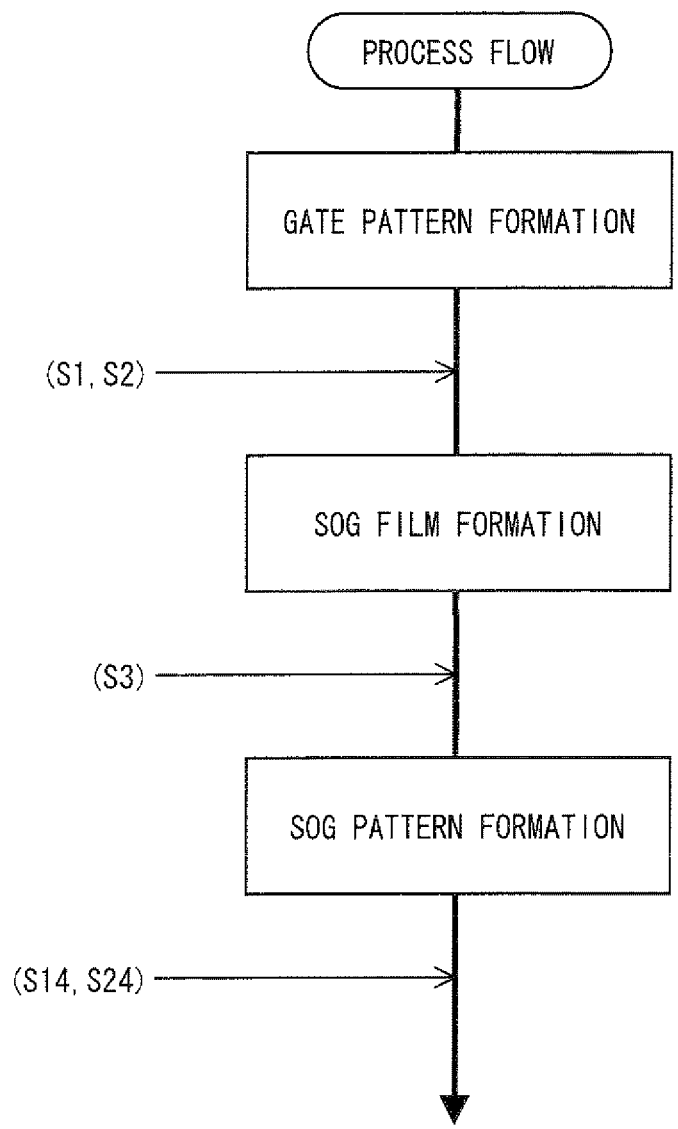
FIG. 3 is a view illustrating the embodiment of the present invention, which view illustrates an overview of a process flow of the active matrix substrate.

FIG. 3 is a view showing a schematic manufacturing process flow of the active matrix substrate 30.

Figure 4:
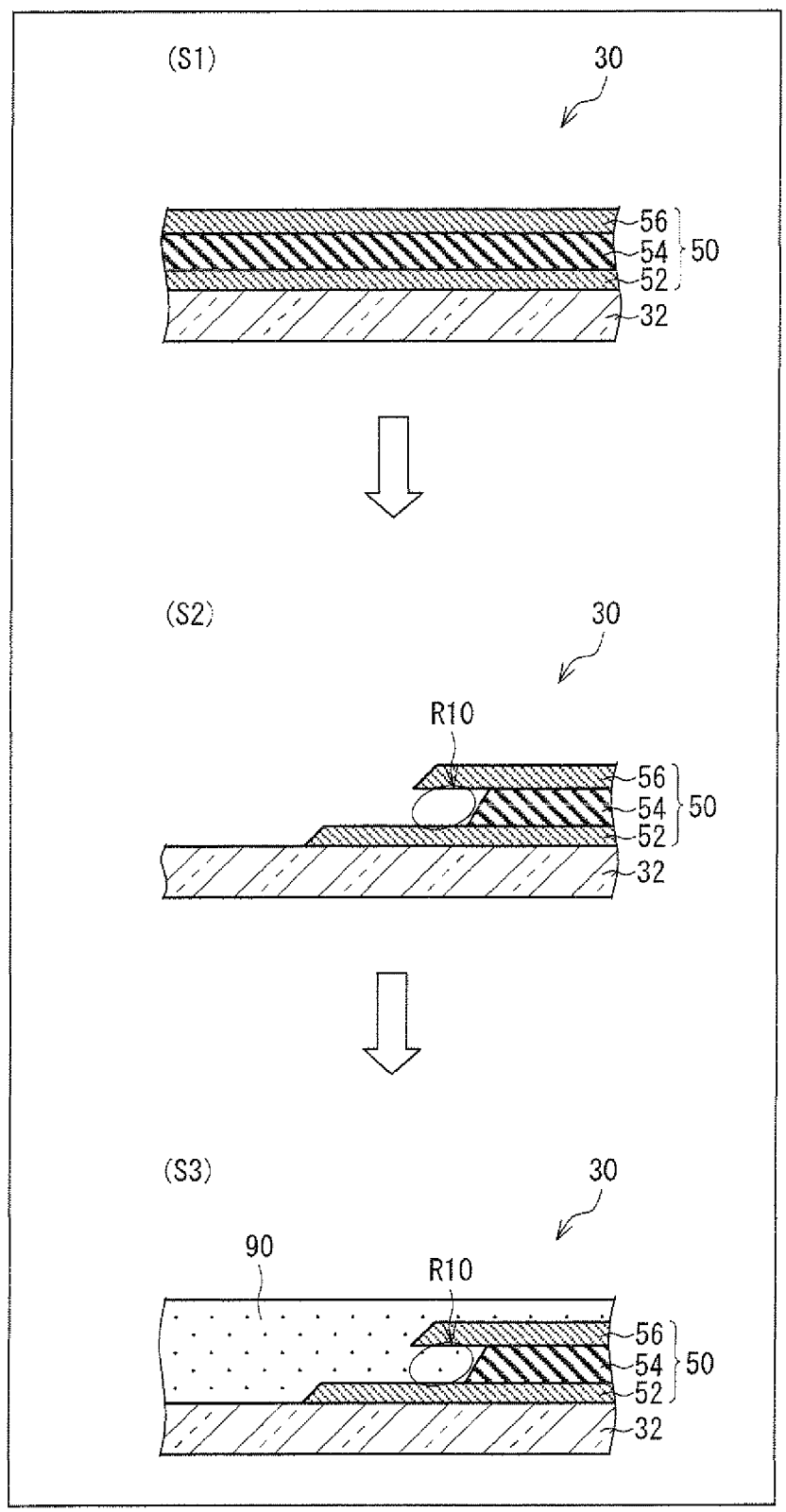
FIG. 4 is a view illustrating the embodiment of the present invention, which view illustrates a flow of manufacture of the active matrix substrate.
Figure 5:
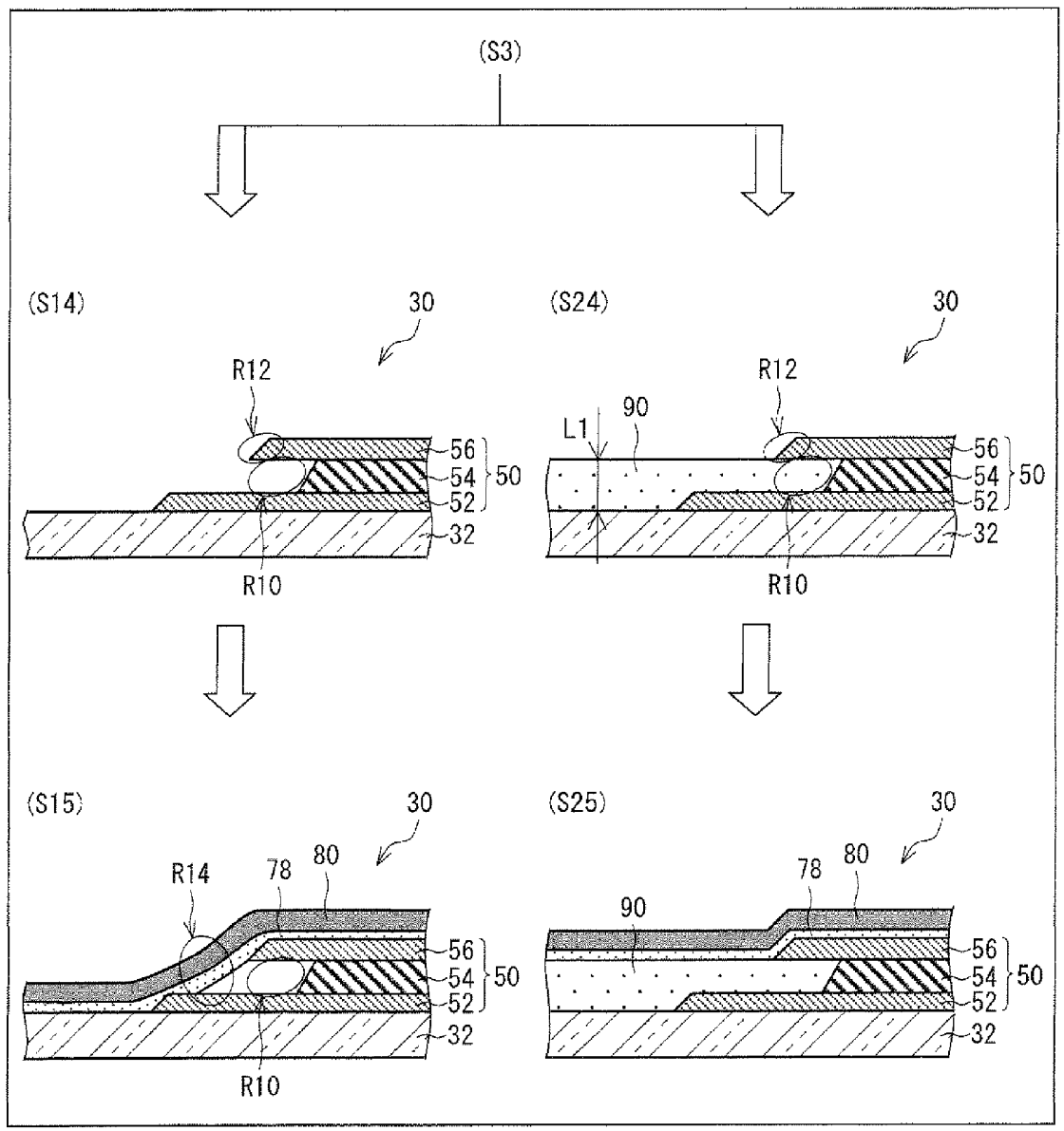
FIG. 5 is a view illustrating a flow of the manufacture of the active matrix substrate, which flow follows S3 of FIG. 4.

Each of FIGS. 4 and 5 is a cross-sectional view illustrating how the line is arranged, during each of the manufacturing processes, in the terminal region RB which is a peripheral region of the active matrix substrate 30. FIG. 5 is a view illustrating manufacturing flows of the active matrix substrate 30 which manufacturing process flows follow S3 of in FIG. 4.

Figure 6:
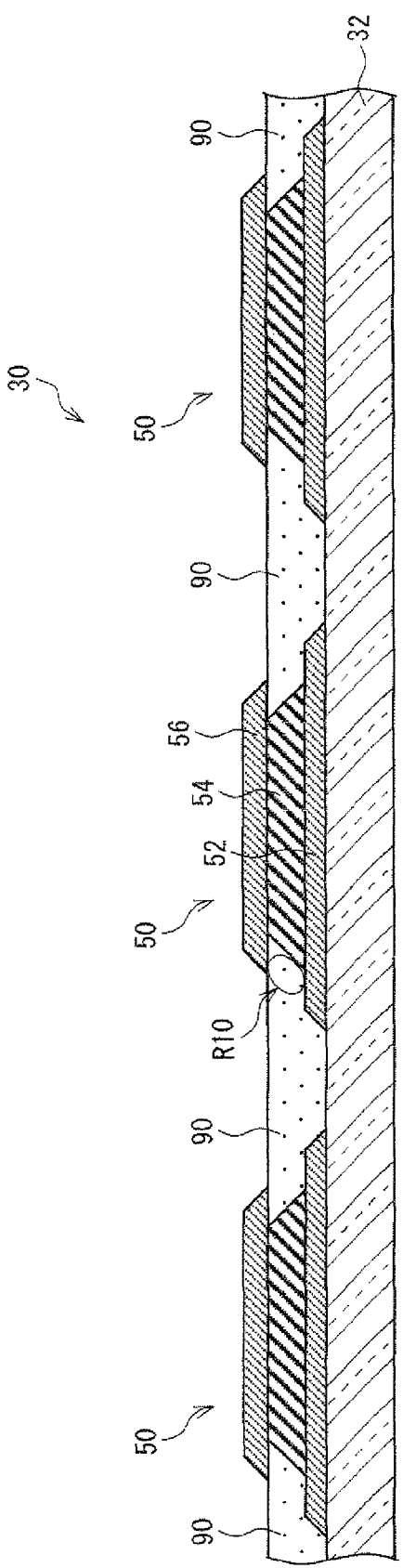
FIG. 6 is a cross-sectional view illustrating the embodiment of the present invention, which cross-sectional view illustrates a cross-section along a line D-D shown in FIG. 1.

FIG. 6 is a view illustrating a cross-section along a line D-D shown in FIG. 1.

As shown in FIG. 3, main ones of the manufacturing processes of the active matrix substrate 30 in accordance with the present embodiment are a process of forming the gate lines 50 and a process of forming the interlayer insulating layers 90. Therefore, the following description mainly deals with the main processes.

(Gate Pattern Formation (S1 and S2 of FIG. 4))

An active matrix substrate 30 having structures illustrated in S1 and S2 of FIG. 4 are obtained by carrying out a gate pattern formation shown in FIG. 3.

(S1)

Specifically, a layer (the following description will be made with the use of the gate lines 50) is formed on the entire surface of the substrate 32 from which layer the gate electrode 72 (part of the thin-film transistor 70) and the gate line 50 (circuitry except the part of the thin-film transistor 70) are made (Structure S1).

In the present embodiment, the gate line 50 is formed as a three-layered structure. That is, a first titanium layer 52, an aluminum layer 54, and a second titanium layer 56 are stacked in this order from a glass substrate 32 side. The three layers constitute together one layer from which the gate line 50 is made.

In the present embodiment, thicknesses of the respective three layers are as below: the first titanium layer 52 has a thickness of 0.03 μm; the aluminum layer 54 has a thickness of 0.27 μm, the second titanium layer 56 has a thickness of 0.15 μm. It follows that the gate line 50 has an entire thickness of 0.45 μm.

A structure of the gate lines 50 is not limited to the three-layered structure but can be a structure having four or more layers, or, a single or two layers.

Even in the case of the three-layered structure, materials of the respective three layers are not limited to the examples above. Alternatively, for example, molybdenum can be used instead of titanium.

(S2)

Then, the active matrix substrate 30 having the structure illustrated in S2 of FIG. 4 is obtained by carrying out etching such as gate wet etching or gate dry etching.

Specifically, the gate line 50 having a desired shape is obtained by carrying out patterning with respect to each of the three layers (i.e., the first titanium layer 52, the aluminum layer 54, and the second titanium layer 56) formed on the almost entire surface of the glass substrate 32.

In some cases, as illustrated in S2 of FIG. 4, the aluminum layer 54 which is a middle one of the three layers constituting the gate lines 50 is etched to a greater degree than the first titanium layer 52 and the second titanium layer 56 in the patterning, due to effects such as chemical solution resistance in wet etching or the like. As a result, a gap R10 is formed between the first titanium layer 52 and the second titanium layer 56.

(SOG Film Formation (S3 of FIG. 4))

Then, an active matrix substrate 30 having a structure illustrated in S3 of FIG. 4 is obtained by carrying out an SOG film formation shown in FIG. 3.

Specifically, SOG is applied on the gate lines 50 which have been patterned so that the interlayer insulating layer 90 (the so-called SOG layer) is formed on the almost entire surface of the glass substrate 32.

More specifically, the interlayer insulating layer 90 is formed by applying a spin-on glass material containing an organic component (i.e., organic SOG material) or the like onto the surface of the glass substrate 32 by an applying method such as slit coating, spin coating, or a printing method.

The interlayer insulating layer 90 is formed by the applying method on the entire surface of the glass substrate 32 so as to have a thickness (i.e., so as to have a film thickness greater than that of the gate line 50). This causes the interlayer insulating layer 90 to be also formed in the gap R10 which is formed in the gate line 50 during the gate wet etching.

A material of the interlayer insulating layer 90 is not particularly limited, provided that the material has an insulation property. For example, SOG materials such as an SOG material having an Si—O—C skeleton and an SOG material having an Si—O skeleton are suitably used as the organic SOG material above. By applying each of the SOG materials onto the substrate 32, a glass film (silica film) can be easily obtained. In general, each of the organic SOG materials has a low specific inductive capacity, and makes it possible to form a thick film. In the present embodiment, the interlayer insulating layer 90 has a thickness of approximately 1.5 μm from the surface of the glass substrate 32.

(SOG Pattern Formation (S14 and S24 of FIG. 5))

Then, an active matrix substrate 30 having structures illustrated in respective S14 and S15 of FIG. 5 is obtained by carrying out processes such as SOG photolithography (patterning of an SOG resist) and SOG dry etching (removal of the SOG film (SOG layer) from a TFT channel section, the storage capacitor section (Cs section), and a terminal section (terminal region)).

FIG. 5 is a cross-sectional view of the active matrix substrate 30 in the terminal region RB, and illustrates a flow following S3 of FIG. 4. In FIG. 5, S14 illustrates an active matrix substrate 30 made by a conventional manufacturing method, whereas S24 illustrates the active matrix substrate 30 of the present embodiment.

(S14)

First, the following describes S14 which is in accordance with the conventional manufacturing method.

According to the conventional manufacturing method, the interlayer insulating layer 90 formed on the almost entire surface of the glass substrate 32 was removed almost entirely in the peripheral region when the interlayer insulating layer 90 is patterned so as to have a desired pattern.

Specifically, in the pixel region RA described above with reference to FIG. 2, the interlayer insulating layer 90 is left as desired on the glass substrate 32 whereas, in the terminal region RB, the interlayer insulating layer 90 is removed so that an electrical connection can be carried out with respect to the gate line 50 (see the cross-sectional view of FIG. 5).

More specifically, (i) the interlayer insulating layer 90 formed on an upper surface of the gate line 50 and (ii) the interlayer insulating layer 90 formed on the glass substrate 32 on the periphery of the upper surface of the gate line 50 were removed in the terminal region RB.

Accordingly, in the terminal region RB, no interlayer insulating layer 90 was provided not only on the upper surface of the gate line 50 but also on its edge face.

Figure 11:
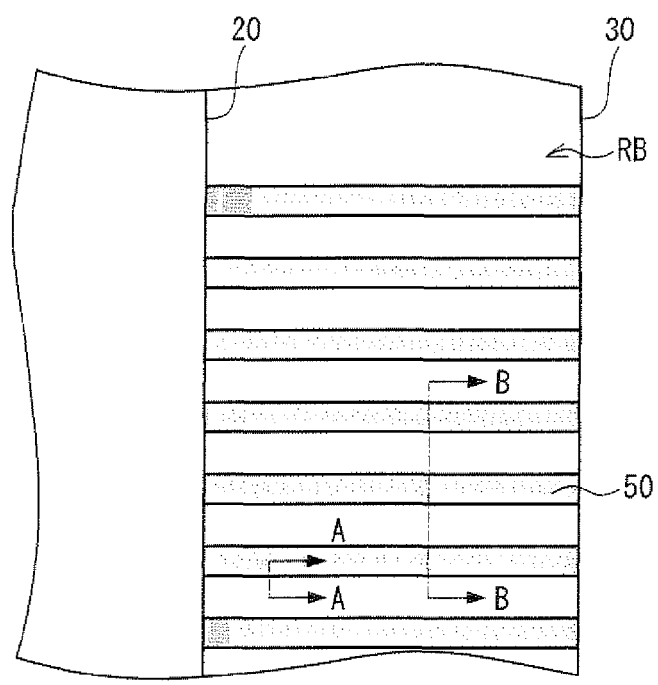
FIG. 11 is a schematic top view illustrating an arrangement of a terminal in the terminal region.
Figure 12:
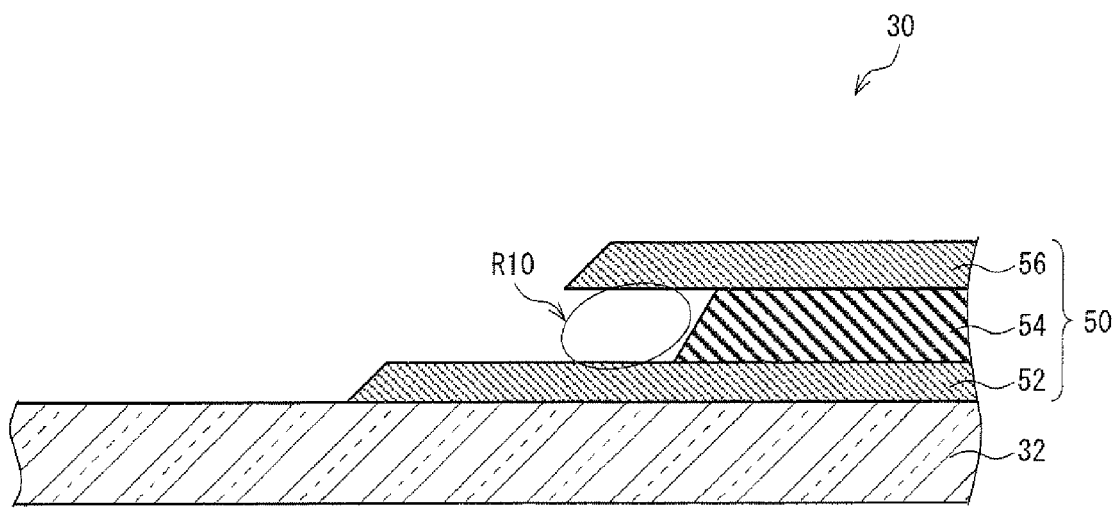
FIG. 12 is a cross-sectional view illustrating a conventional liquid crystal display apparatus, which cross-sectional view corresponds to a cross-section along a line A-A shown in FIG. 11.

It should be noted that S14 of FIG. 5 is a view corresponding to a cross-section taken along a line A-A shown in FIG. 11.

(S24)

The following describes S24 which is in accordance with the present embodiment.

In contrast with S14, according to the present embodiment, patterning is carried out so that the interlayer insulating layer 90 in the terminal region RB partially remains, instead of entirely removing the interlayer insulating layer 90.

Specifically, the interlayer insulating layer 90 formed on the upper surface of the gate line 50 is removed, whereas the interlayer insulating layer 90 which is formed so as to have contact with the edge face of the gate line 50 is not removed.

That is, the interlayer insulating layer 90 having a thickness of 0.3 μm is left on the edge face of the gate line 50 so as to have contact with the edge face.

It should be noted that S24 of FIG. 5 is a view corresponding to a cross-section taken along a line C-C shown in FIG. 1.

Figure 7:
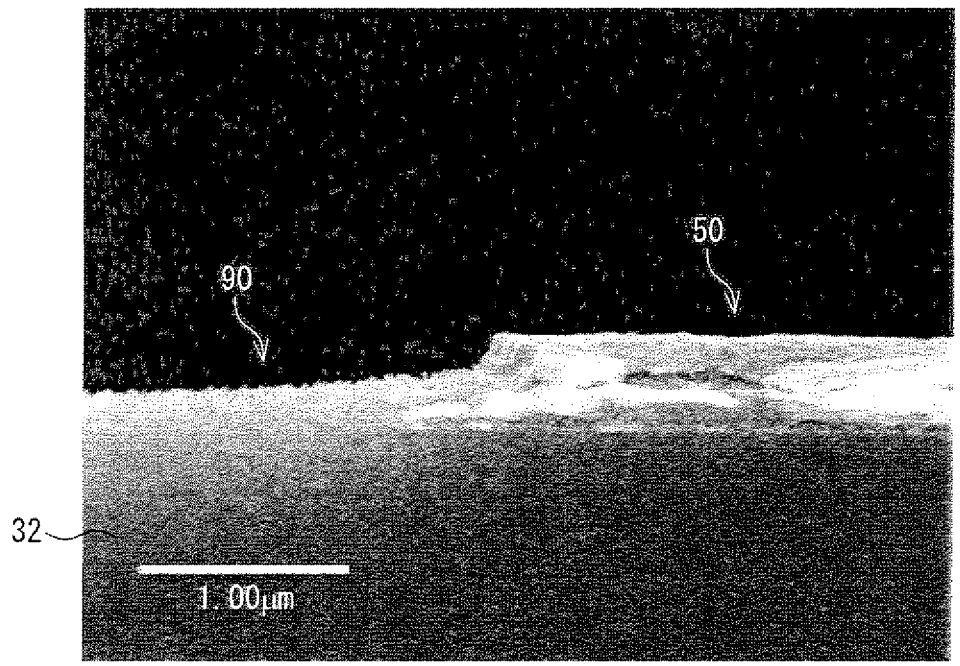
FIG. 7 is an electron photomicrograph of the embodiment of the present invention, which electron photomicrograph shows a cross-section along a line C-C shown in FIG. 1.

FIG. 7 is an electron micrograph showing a cross-sectional shape of a part corresponding to S24 of FIG. 5.

According to the present embodiment, each of the interlayer insulating layers 90 is left so as to fill a corresponding region between adjacent two of the plurality of gate lines 50. In other words, each of the interlayer insulating layers 90 is left continuously in a corresponding region between adjacent two of the plurality of gate lines 50 (see FIG. 1 and FIG. 6 which is a cross-sectional view of the cross-section along the line D-D shown in FIG. 1).

There is no specific limitation of a length of each of the interlayer insulating layers 90 which is left so as to have contact with the edge face of the gate line 50 in the terminal region RB, which length is one measured from the edge face in a direction parallel with the surface of the glass substrate 32. That is, a width of each of the interlayer insulating layers 90 is not particularly limited. In addition, it is not always necessary to fill each of the interlayer insulating layers 90 in an entire corresponding area between adjacent two of the plurality of gate lines 50, unlike FIG. 1.

Note however that the width of each of the interlayer insulating layers 90 is preferably not less than its layer thickness, from viewpoints of (i) suppression of exfoliation of a gate line 50 due to the presence a corresponding one of the interlayer insulating layers 90 and (ii) suppression of exfoliation of an interlayer insulating layer 90 itself.

That is, in a case where each of the interlayer insulating layers 90 has a thickness of 0.3 μm in a part where it has contact with an edge face of a corresponding one of the plurality of gate lines 50, it preferably has a length of not less than 0.3 μm from the edge face in the direction parallel with the surface of the glass substrate 32.

(Exfoliation)

In the conventional active matrix substrate 30, as described above, nothing is filled in the gap R10 of the gate line 50 after the interlayer insulating layers 90 are patterned (see FIGS. 11 and S14 of FIG. 4). Therefore, an eaves-like part (see a region R12) of the second titanium layer 56, which eaves-like part is an upper side of the gap of the gate line 50, is not directly supported from below.

Figure 13:
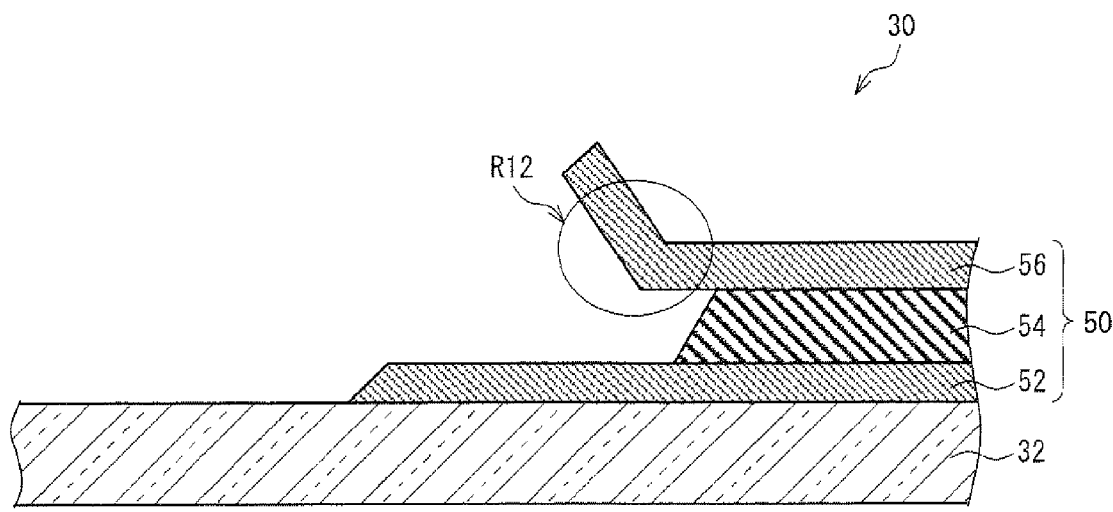
FIG. 13 is a view illustrating the conventional liquid crystal display apparatus, which view illustrates exfoliation of a gate line.
Figure 15:
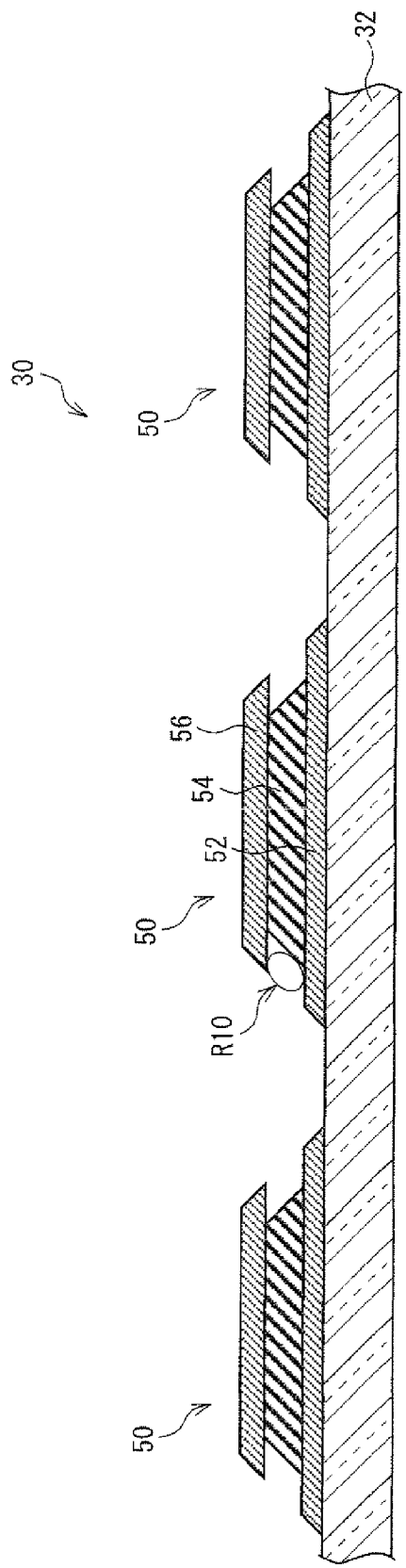
FIG. 15 is a cross-sectional view illustrating the conventional liquid crystal display apparatus, which corresponds to a cross-section along a line B-B shown in FIG. 11.

Therefore, as described above with reference to FIG. 13, the eaves-like part was easy to exfoliate or the eaves-like part was easy to bend.

In contrast, according to the active matrix substrate 30 of the present embodiment, the gap R10 of the gate line 50 is filled with the interlayer insulating layer 90 (see S24 of FIG. 5). Accordingly, the interlayer insulating layer 90 is located under the eaves-like part (see the region R12) of the second titanium layer 56. It follows that the eaves-like part is directly supported from below by the interlayer insulating layer 90.

This suppresses a substrate defect caused by the exfoliation of or the folding back of the gate line 50.

(Cutting)

The following describes formations of the gate insulating layer 78 and the channel semiconductor layer 80. As described above with reference to FIG. 2, according to the active matrix substrate 30, the gate insulating layer 78 and the channel semiconductor layer 80 are formed on the interlayer insulating layer 90 so as to form the thin-film transistor 70.

The gate insulating layer 78 and the channel semiconductor layer 80 are generally formed by forming them on an entire surface of the substrate, and then by patterning them so that a desired pattern is obtained.

The following separately describes a conventional manufacturing method (see S15 of FIG. 5) and a manufacturing method of the present embodiment (see S25 of FIG. 5).

(S15 of FIG. 5)

The conventional manufacturing method is described first. According to the conventional manufacturing method, after S14 is carried out, the gate insulating layer 78 and the channel semiconductor layer 80 are stacked in this order on the entire surface of the active matrix substrate 30.

Accordingly, the gate insulating layer 78 and the channel semiconductor layer 80 are formed on the gate line 50 while the gap R10 is being included in the gate line 50 (see S14 of FIG. 5). Therefore, as illustrated in S15 of FIG. 5, no layer resides under the gate insulating layer 78 and the channel semiconductor layer 80 in a region where the gap R10 is formed. As a result, the gate insulating layer 78 and the channel semiconductor layer 80 are not directly supported from below (see a region R14 illustrated in S15 of FIG. 5).

As described above with reference to FIG. 14, the gate insulating layer 78 and the channel semiconductor layer 80 are likely to be cut, i.e., are likely to have a break caused in the region R14 where the gate insulating layer 78 and the channel semiconductor layer 80 are not directly supported from below.

(S25 of FIG. 5)

In contrast, the active matrix substrate 30 of the present embodiment is less likely to be cut. This is described below.

According to the manufacturing method of the present embodiment, the interlayer insulating layer 90 remains and fills in the gap R10 of the gate line 50 (see S24 of FIG. 5), after the interlayer insulating layer 90 is patterned.

Therefore, even in a case where the gate insulating layer 78 and the channel semiconductor layer 80 are formed on the gate line 50, the gate insulating layer 78, the channel semiconductor layer 80, and the upper layer of the gate line 50 are supported from below by their respective lower layers.

Therefore, according to the present embodiment, the cutting as is described with reference to FIG. 14 is less likely to occur.

(Single-layered Gate Line Structure)

The present embodiment deals with the case of the gate line 50 having a three-layered structure. However, the present invention is not limited to this.

For example, the gate line 50 can have a structure made up of four or more layers, a single layer, or two layers.

The following deals with an arrangement in which the gate line 50 has a single-layered structure.

Figure 8:
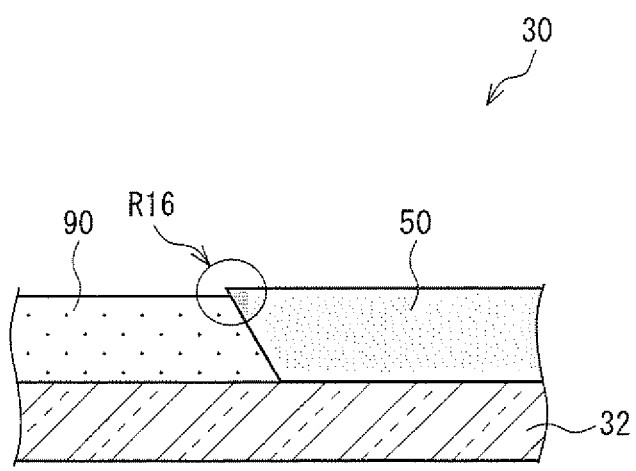
FIG. 8 is a view of another embodiment of the present invention, which view corresponds to the cross-section along the line C-C shown in FIG. 1.

FIG. 8 is a view of another embodiment of the present invention. The view corresponds to the cross-section taken along the line C-C shown in FIG. 1, and corresponds to S24 of FIG. 5.

Figure 9:
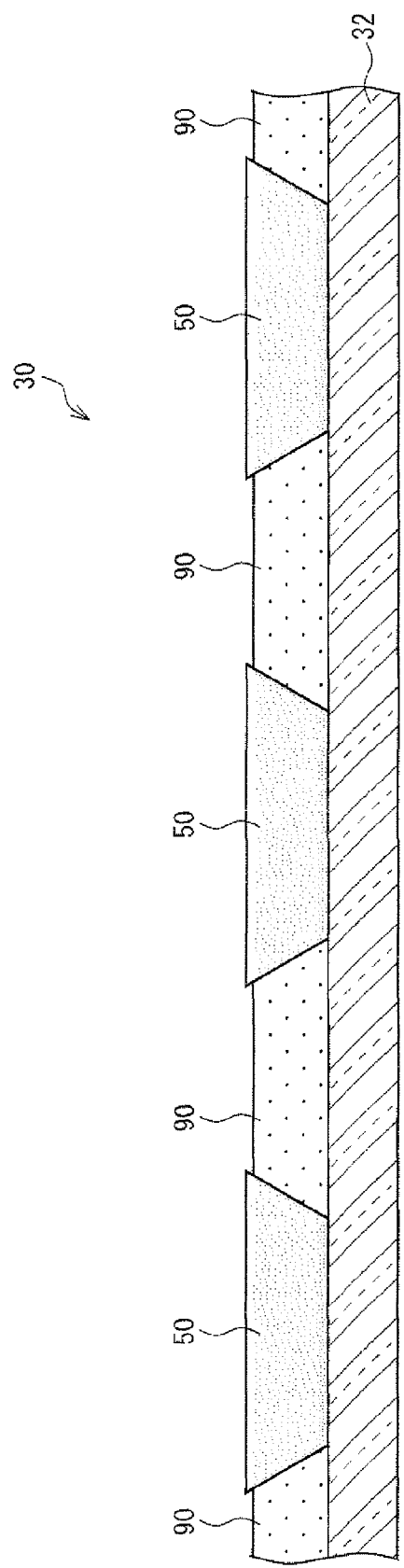
FIG. 9 is a view of the another embodiment of the present invention, which view corresponds to the cross-section along the line D-D shown in FIG. 1.

Similarly, FIG. 9 is a view corresponding to the cross-section taken along the line D-D shown in FIG. 1, and corresponding to FIG. 6.

A single-layered gate line structure is formed in broadly the same manufacturing process flow as that of the three-layered gate line structure, except that, instead of stacking the three layers made up of titanium, aluminum, and titanium, only a single layer forms, on the substrate 32, a layer to become the gate electrode 72 (a region where the thin-film transistor 70 is formed) and the gate line 50 (circuitry other than the region where the thin-film transistor 70 is formed).

This leads to a difference in cross-sectional shape of the gate line 50 that has been subjected to the gate pattern formation which is described above with reference to FIG. 3.

That is, the difference resides in that the gate line 50 itself, which has been pattered, sometimes has an inverse tapered shape, instead of a gap being formed in the intermediate layer (i.e., the aluminum layer 54) of a cross-section of the gate line 50 that has been pattered.

The following mainly describes the difference.

Figure 16:
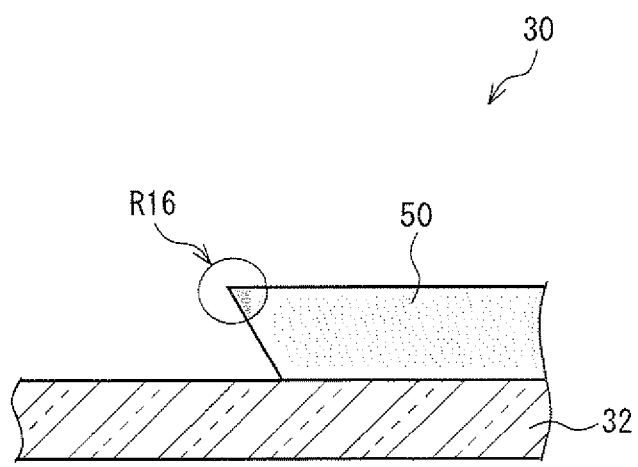
FIG. 16 is a cross-sectional view illustrating another conventional liquid crystal display apparatus, which view corresponds to a cross-section along the line A-A shown in FIG. 11.
Figure 17:
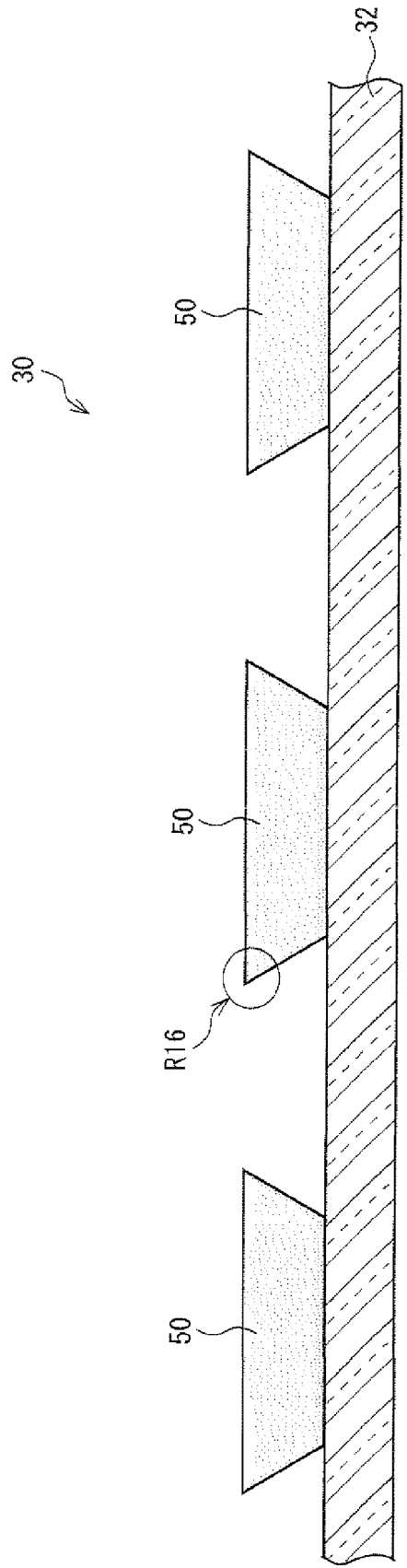
FIG. 17 is a cross-sectional view illustrating the another conventional liquid crystal display apparatus, which view corresponds to a cross-section along the line B-B shown in FIG. 11.

That is, as described above with reference to FIG. 16, in the single-layered gate line structure, a cross-sectional shape of the gate line 50 in the terminal region 50 has a so-called inverse tapered shape in some cases after the gate line 50 is patterned in the gate pattern formation (see FIG. 3). As described above, the inverse tapered shape intends to a shape of the gate line 50 whose line width becomes wider as the gate line 50 is farther away from the glass substrate 32. That is, according to the inverse tapered shape, the gate line 50 has the narrowest line width at its part where the gate line 50 has contact with the glass substrate 32.

In the present embodiment, the interlayer insulating layer 90 (SOG) is applied to the entire surface of the glass substrate 32 (i.e., SOG FILM FORMATION shown in FIG. 3), and then, is subjected to patterning (SOG PATTERN FORMATION shown in FIG. 3). The patterning is carried out so that the interlayer insulating layer 90 having contact with the edge face of the gate line 50 in the terminal region RB partially remains as is the case with the three-layered gate line structure, instead of removing all the interlayer insulating layer 90 in the terminal region RB.

In other words, the interlayer insulating layer 90 on the gate line 50 is removed whereas the rest is left.

As a result, an inverse tapered section of the gate line 50 is filled with the interlayer insulating layer 90, as is illustrated in FIGS. 8 and 9.

This makes it possible to suppress exfoliation of the gate line 50 caused by, e.g., a stress on an edge part (R16) of the inverse tapered section of the gate line 50.

Furthermore, the gate insulating layer 78 and the channel semiconductor layer 80 are less likely to be cut due to the presence of the edge part (R16) even in a case where the gate insulating layer 78 and the channel semiconductor layer 80 are further stacked on the gate line 50 as is the case with the three-layered gate line structure.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

The above exemplifies a layer thickness of 0.3 μm of the interlayer insulating layer 90 at its part having contact with the edge face of the gate line 50. A thickness of the interlayer insulating layer 90 is not limited to this, provided that the thickness is not more than a thickness of the gate line 50. From a viewpoint of sure suppression of defects of the gate line 50, the thickness of the interlayer insulating layer 90 is preferably not less than 50% of the thickness of the gate line 50, or more preferably, not less than 75% of the thickness of the gate line 50.

The above exemplifies a length of 0.3 μm of the interlayer insulating layer 90. The length is measured from the edge face of the gate line 50 along the direction parallel with the surface of the glass substrate 32. The length (width of the interlayer insulating layer 90) is not less than the thickness of the gate line 50. From a viewpoint of further improvement of adhesion of the interlayer insulating layer 90, the width is preferably not less than 18 μm. In a case where a plurality of gate lines 50 are formed contiguously, the interlayer insulating layer 90 can be formed continuously so as to reach the plurality of gate lines 50.

INDUSTRIAL APPLICABILITY

Since the present invention makes it possible to reduce defects caused in manufacture and component mounting of an active matrix substrate, the present invention is applicable to manufacture of a liquid crystal display apparatus which is required to be low-cost and highly reliable.

The invention claimed is:

1. An active matrix substrate comprising:
a substrate;
at least one line formed on the substrate; and
an insulating layer for electrically insulating a layer formed on the at least one line from the at east one line,
the at least one line having a multilayered structure comprising (i) a line in a top layer, (ii) a middle line directly below the line in the top layer, the line in the top layer protruding, in a direction in which the line in the top layer extends, more than the line directly below the line in the top layer as viewed in a cross sectional direction, and (iii) a bottom line located directly below the middle line, the bottom line protruding, in the direction in which the line in the top layer extends, more than the line in the top layer as viewed in the cross sectional direction;
wherein in a region of the substrate,
the insulating layer not being provided on an upper surface of the at least one line, the upper surface being exposed,
the insulating layer being provided on the substrate with a thickness of not more than a film thickness of the at least one line so as to have contact with at least an edge face of the line directly below the line in the top layer, the edge face being on an extension of a longitudinal direction of the line directly below the line in the top layer.

2. The active matrix substrate as set forth in claim 1, wherein the insulating layer is provided on the substrate so as to have contact with the edge face in the region of the substrate.

3. The active matrix substrate as set forth in claim 1, wherein the region of the substrate is a peripheral region of the substrate.

4. The active matrix substrate as set forth in claim 1, wherein the region of the substrate is a connection region of the substrate.

5. The active matrix substrate as set forth in claim 1, wherein the insulating layer, which has contact with the edge face, has a width of not less than a film thickness of the insulating layer, from the edge face at least in a direction parallel with the substrate.

6. The active matrix substrate as set forth in claim 1, wherein:
   a thin-film transistor serving as a switching element is formed on the substrate; and
   the at least one line is a gate line connected with the thin-film transistor, a source line connected with the thin-film transistor, or both the gate line and the source line.

7. The active matrix substrate as set forth in claim 1, wherein
   the region of the substrate includes a terminal region where the at least one line is electrically connected with a component.

8. The active matrix substrate as set forth in claim 1, wherein:
   the substrate has a rectangular shape; and
   the region of the substrate includes at least one of four peripheral regions of the substrate.

9. The active matrix substrate as set forth in claim 1, wherein
   the insulating layer is made of an insulating material containing an organic component.

10. The active matrix substrate as set forth in claim 9, wherein the insulating layer contains silicon.

11. A liquid crystal display apparatus comprising an active matrix substrate recited in claim 1.

12. A method for manufacturing an active matrix substrate on which a thin-film transistor serving as a switching element is formed, the method comprising the steps of:
   (a) forming a pattern of a line on a substrate;
   (b) forming an insulating layer so as to cover the line; and
   (c) patterning the insulating layer,
   wherein:
   in the step (c), the insulating layer on an upper surface of the line is removed so that the upper surface is exposed in a region where the line is electrically connected with a component, whereas the insulating layer which has contact with an edge face of the line is left in the region, wherein the line has a multilayered structure comprising (i) a line in a top layer, (ii) a middle line directly below the line in the top layer, the line in the top layer protruding, in a direction in which the line in the top layer extends, more than the line directly below the line in the top layer as viewed in a cross sectional direction, and (iii) a bottom line located directly below the middle line, the bottom line protruding, in the direction in which the line in the top layer extends, more than the line in the top layer as viewed in the cross sectional direction
   wherein the insulating layer is provided on the substrate with a thickness of not more than a film thickness of the at least one line so as to have contact with at least an edge face of the line directly below the line in the top layer, the edge face being on an extension of a longitudinal direction of the line directly below the line in the top layer.

* * * * *